(12) United States Patent
Lin et al.

(10) Patent No.: US 9,142,488 B2
(45) Date of Patent: Sep. 22, 2015

(54) MANGANESE OXIDE HARD MASK FOR ETCHING DIELECTRIC MATERIALS

(71) Applicant: International Business Machines Corporation, Armonk, NY (US)

(72) Inventors: Wei Lin, Albany, NY (US); Spyridon Skordas, Wappingers Falls, NY (US); Tuan A. Vo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/905,298

(22) Filed: May 30, 2013

(65) Prior Publication Data
US 2014/0353839 A1  Dec. 4, 2014

(51) Int. Cl.
| | |
|---|---|
| H01L 23/522 | (2006.01) |
| H01L 23/485 | (2006.01) |
| H01L 23/48 | (2006.01) |
| H01L 21/768 | (2006.01) |

(52) U.S. Cl.
CPC ........ *H01L 23/481* (2013.01); *H01L 21/76898* (2013.01); *H01L 23/485* (2013.01); *H01L 23/5222* (2013.01); *H01L 23/5226* (2013.01); *Y10T 428/24331* (2015.01)

(58) Field of Classification Search
CPC ............ H01L 23/5222; H01L 23/5226; H01L 23/485
USPC ........................................................ 257/758
See application file for complete search history.

(56) References Cited

U.S. PATENT DOCUMENTS

| | | | |
|---|---|---|---|
| 5,668,694 | A | 9/1997 | Sato et al. |
| 6,140,226 | A | 10/2000 | Grill et al. |
| 6,448,176 | B1 | 9/2002 | Grill et al. |
| 6,472,107 | B1 | 10/2002 | Chan |
| 7,052,621 | B2 | 5/2006 | Kumar et al. |
| 8,093,149 | B2 | 1/2012 | Tomita |
| 8,222,160 | B2 * | 7/2012 | Uozumi .................. 438/749 |
| 8,247,321 | B2 | 8/2012 | Matsumoto et al. |
| 2009/0291388 | A1 | 11/2009 | Assefa et al. |

(Continued)

FOREIGN PATENT DOCUMENTS

KR   1020090052517   5/2009

OTHER PUBLICATIONS

Holleman-Wiberg, Inorganic Chemistry, Academic Press 2001, Chapter 24, "Manganese, Technetium and Rhenium" pp. 1051-1058.
Fox, P.M. et al., "The Kinetics of Iodide Oxidation by the Manganese Oxide Mineral Birnessite" Geochimica et Cosmochimica Acta (May 15, 2009) pp. 2850-2861, vol. 73, Issue 10.
Furlani, G. et al., "Reductive Acid Leaching of Manganese Dioxide with Glucose: Identification of Oxidation Derivatives of Glucose" Hydrometallurgy (Mar. 2006) pp. 234-240, vol. 81, Issue 3-4.

(Continued)

*Primary Examiner* — Phat X Cao
(74) *Attorney, Agent, or Firm* — Scully, Scott, Murphy & Presser, P.C.; Catherine Ivers, Esq.

(57) ABSTRACT

A manganese oxide layer is deposited as a hard mask layer on substrate including at least a dielectric material layer. An optional silicon oxide layer may be formed over the manganese oxide layer. A patterned photoresist layer can be employed to etch the optional silicon oxide layer and the manganese oxide layer. An anisotropic etch process is employed to etch the dielectric material layer within the substrate. The dielectric material layer can include silicon oxide and/or silicon nitride, and the manganese oxide layer can be employed as an effective etch mask that minimizes hard mask erosion and widening of the etched trench. The manganese oxide layer may be employed as an etch mask for a substrate bonding process.

20 Claims, 11 Drawing Sheets

(56) References Cited

U.S. PATENT DOCUMENTS

| | | | |
|---|---|---|---|
| 2012/0070613 A1 | 3/2012 | Stowers et al. | |
| 2012/0164822 A1* | 6/2012 | Lin et al. | 438/591 |
| 2012/0258388 A1 | 10/2012 | Yamada et al. | |
| 2013/0207068 A1* | 8/2013 | Pellizzer | 257/5 |
| 2014/0001532 A1* | 1/2014 | Sakamoto | 257/316 |

OTHER PUBLICATIONS

Pankratova, A.B. et al., "Dissolution Kinetics of Manganese (III, Iv) Oxides in Sulfuric Acid in the Presence of Ethylenediaminetetraacetic Acid" Theoretical Foundations of Chemical Engineering (Mar. 2001) pp. 168-174, col. 35, No. 2.

* cited by examiner

MANGANESE OXIDE HARD MASK FOR ETCHING DIELECTRIC MATERIALS

BACKGROUND

This disclosure relates to a method of forming trenches employing a manganese oxide hard mask layer and structures formed by the same.

Hard mask erosion limits parameters of anisotropic etch processes, and particularly, the depth of a trench that can be formed by the anisotropic etch processes. The erosion of hard mask is particularly problematic if the etched material is a dielectric material. For example, a hard mask including silicon oxide tends to be etched at a significant rate while etching a silicon-oxide-containing material such as organosilicate glass (OSG) and doped silicate glass. Hard mask erosion can induce widening of a trench at an upper portion, thereby causing formation of a tapered trench. Further, when such a tapered trench is filled with a conductive material, for example, in order to form a through substrate via (TSV) structures, the resulting conductive structure includes a tapered portion at which the conductive structure occupies more area than a lower portion making contact with a contact pad.

In view of the above, a method for forming a trench through a thick dielectric material with no, or minimal, erosion of a hard mask material is desired.

SUMMARY

A manganese oxide layer is deposited as a hard mask layer on substrate including at least a dielectric material layer. An optional silicon oxide layer may be formed over the manganese oxide layer. A patterned photoresist layer can be employed to etch the optional silicon oxide layer and the manganese oxide layer. An anisotropic etch process is employed to etch the dielectric material layer within the substrate. The dielectric material layer can include silicon oxide and/or silicon nitride, and the manganese oxide layer can be employed as an effective etch mask that minimizes hard mask erosion and widening of the etched trench. The manganese oxide layer may be employed as an etch mask for a substrate bonding process.

According to an aspect of the present disclosure, a structure includes a manganese oxide layer located on a substrate, and a trench extending through an opening in the manganese oxide layer and into the substrate. A periphery of the opening is vertically coincident with a periphery of sidewalls of a portion the trench in the substrate.

According to another aspect of the present disclosure, a method of forming a structure is provided. A manganese oxide layer is formed over a substrate. The manganese oxide layer is patterned to form an opening therein. A trench extending through the opening in the manganese oxide layer and into the substrate is formed employing the manganese oxide layer as an etch mask.

The manganese oxide layer enables use of a thinner photoresist layer employed as an etch mask in an anisotropic etch. The manganese oxide layer also reduces a bias voltage employed in the anisotropic etch process. Further, the manganese oxide layer reduces the damage on metal pad structures caused by the anisotropic etch.

DETAILED DESCRIPTION

Figure 1:
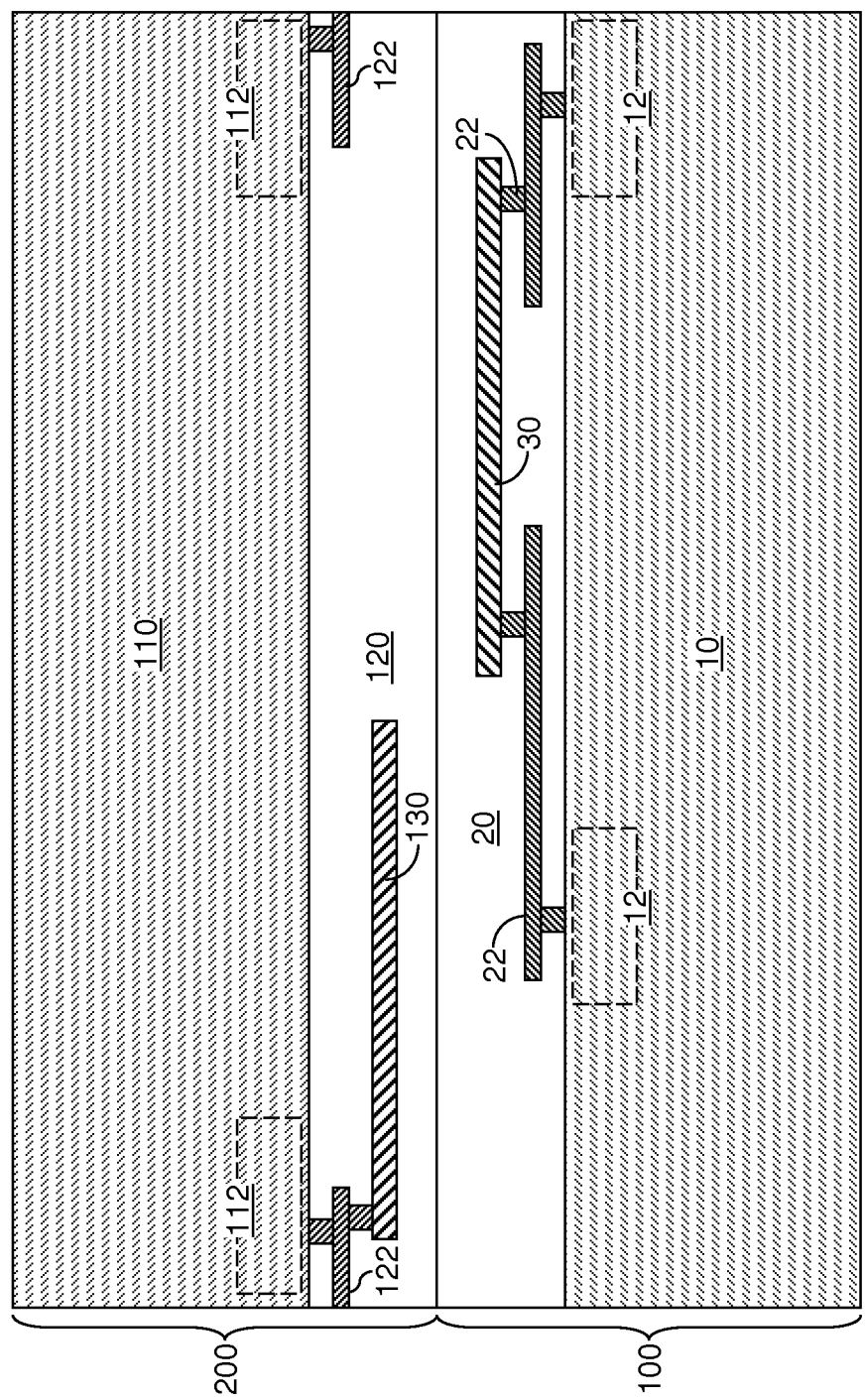
FIG. 1 is a vertical cross-sectional view of a first exemplary structure after bonding a first substrate with a second substrate according to a first embodiment of the present disclosure.

As stated above, the present disclosure relates to a method of forming trenches employing a manganese oxide hard mask layer and structures formed by the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Referring to FIG. 1, a first exemplary structure according to a first embodiment of the present disclosure includes a bonded structure, which includes a first substrate 100 and a second substrate 200 that are bonded to each other at a bonding interface. The first substrate 100 is a carrier substrate, which provides sufficient mechanical strength to the bonded structure for mechanical handling. For example, the thickness of the first substrate 100 can be in a range from 30 microns to 1 mm, although lesser and greater thicknesses can also be employed.

The first substrate 100 can include a stack of a first semiconductor substrate 10 and at least one first dielectric material layer 20. The first semiconductor substrate 10 contains at least one first semiconductor device 12 therein. The at least one first dielectric material layer 20 can embed first metal interconnect structures 22 and a first metallic pad 30 therein. The first metal interconnect structures 22 can include at least one of a conductive via and a conductive metal line. The second substrate 200 can include a stack of a second semiconductor substrate 110 and at least one second dielectric material layer 120. The second semiconductor substrate 110 contains at least one second semiconductor device 112 therein. The at least one second dielectric material layer 120 can embed second metal interconnect structures 122 and a second metallic pad 130 therein. The second metal interconnect structures 122 can include at least one of a conductive via and a conductive metal line.

The at least one first dielectric material layer 20 and the at least one second dielectric material layer 120 can include silicon oxide, silicon oxynitride, silicon nitride, porous organosilicate glass (OSG), non-porous OSG, nitrogen-doped OSG, or any other dielectric materials known in the art for embedding metal interconnect structures. In one embodiment, the distal surface of the at least one first dielectric material layer 20 can be a silicon oxide surface. The distal surface of the at least one first dielectric material layer 20 refers to the surface of the at least one first dielectric material layer 20 that is most distal from the interface between the first semiconductor substrate 10 and the at least one first dielectric material layer 20. Likewise, the distal surface of the at least one second dielectric material layer 120 can be a silicon oxide surface. The distal surface of the at least one second dielectric material layer 120 refers to the surface of the at least one second dielectric material layer 120 that is most distal from the interface between the second semiconductor substrate 110 and the at least one second dielectric material layer 120. Optionally, at least one bonding material layer such as a deposited silicon oxide layer or a polymer layer may be employed to facilitate the bonding process.

In one embodiment, the first substrate 100 and the second substrate 200 can be bonded front-to-front, or "face-to-face." In this case, the first substrate 100 and the second substrate 200 are brought together such that the distal surface of the at least one first dielectric material layer 20 contacts the distal surface of the at least one second dielectric material layer 120. At least one bonding material layer may be optionally employed. An oxide-to-oxide bonding is induced across the bonding interface between the first and second substrates (100, 200) by an anneal, with or without compression of the substrates (100, 200), at an elevated temperature, which can be in a range from 200° C. to 500° C., although lesser and greater temperatures can also be employed. The bonding interface between the first and second substrate (100, 200) can be defined by intermittent cavities caused by imperfections in the planarity of the distal surfaces of the dielectric material layers (10, 20), and/or by a horizontal plane containing imperfections in bonding.

Each of the first metallic pad 30 can be embedded within the at least one first dielectric material layer 20, and can include copper. Each of the first metallic pad 30 can be vertically spaced from the interface between the first and second substrates (100, 200), and the proximal surface of the at least one first dielectric material layer 20. The proximal surface of the at least one first dielectric material layer 20 refers to the surface of the at least one first dielectric material layer 20 that is most proximal to, and contacts, the first semiconductor substrate 10. Each of the second metallic pad 130 can be embedded within the at least one second dielectric material layer 120, and can include copper. Each of the second metallic pad 130 can be vertically spaced from the interface between the first and second substrates (100, 200), and the proximal surface of the at least one second dielectric material layer 120. The proximal surface of the at least one second dielectric material layer 120 refers to the surface of the at least one second dielectric material layer 120 that is most proximal to, and contacts, the second semiconductor substrate 110.

Figure 2:
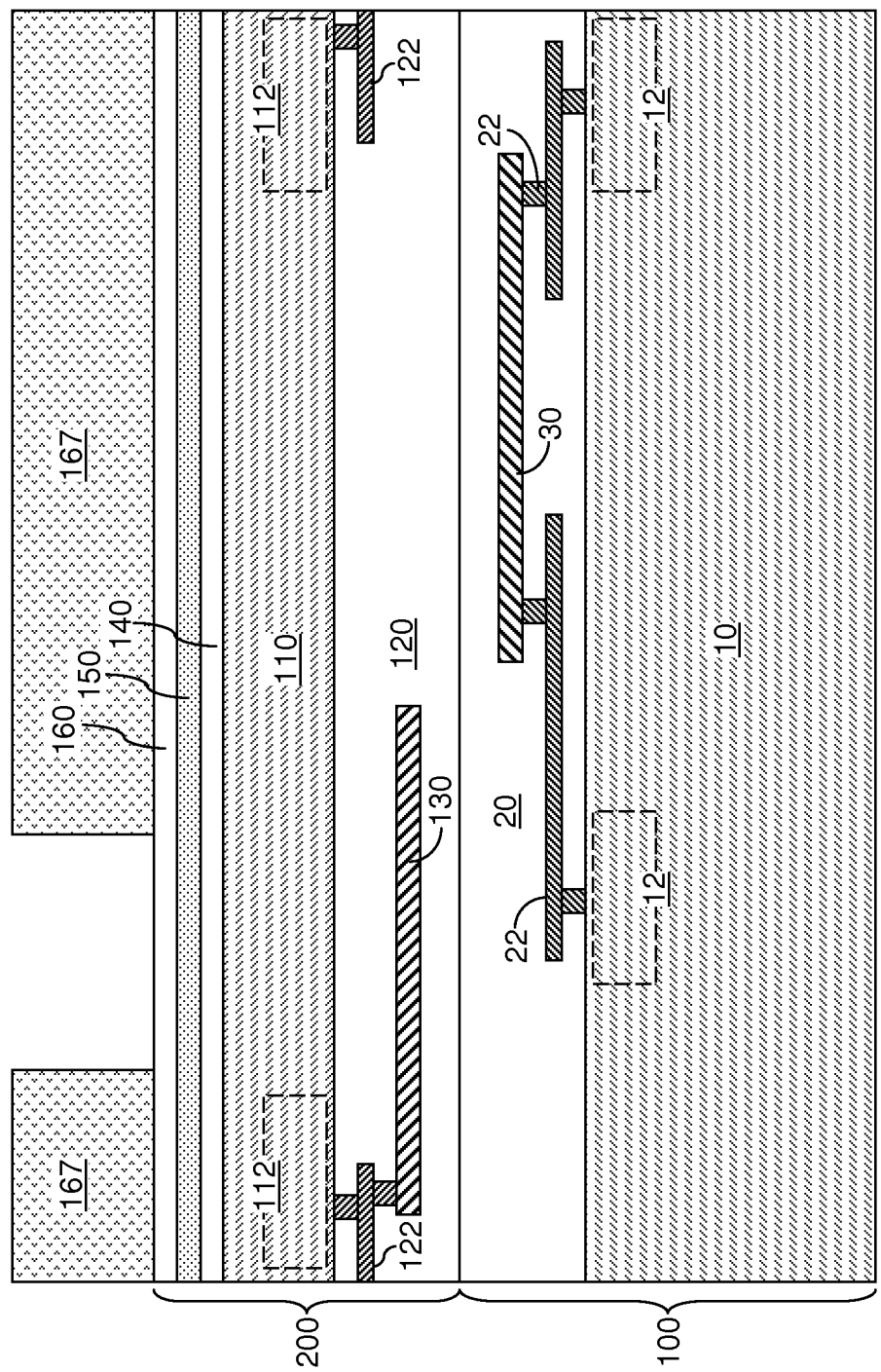
FIG. 2 is a vertical cross-sectional view of the first exemplary structure after formation of a hard mask stack including a manganese oxide layer and application and patterning of a first photoresist layer according to the first embodiment of the present disclosure.

Referring to FIG. 2, a back side portion of the second substrate 200, i.e., a portion on the side of the second substrate 200 that is distal from the bonding interface between the first substrate 100 and the second substrate 200, can be removed to thin the second substrate 200. The removal of the back side portion of the second substrate 200 can be performed by grinding, cleaving, polishing, etching, or a combination thereof. In one embodiment, the second substrate 200 can be thinned to a thickness in a range from 5 microns to 30 microns, although lesser and greater thicknesses can also be employed.

A hard mask stack is formed on the back side surface of the second semiconductor substrate 100. The hard mask stack can include a set of dielectric material layers, which includes at least a manganese oxide layer 150. In one embodiment, the hard mask stack can include a dielectric adhesion promoter layer 140, a manganese oxide layer 150, and an optional hard mask dielectric material layer 160.

The dielectric adhesion promoter layer 140 is a dielectric layer including a dielectric material. In one embodiment, the dielectric adhesion promoter layer 140 includes silicon oxide. The dielectric adhesion promoter layer 140 can be formed, for example, by chemical vapor deposition (CVD) or by oxidation of a surface portion of the semiconductor material in the second semiconductor substrate 110. In one embodiment, the dielectric adhesion promoter layer 140 can be formed directly on a semiconductor surface of the second semiconductor substrate 110. As used herein, a first element is "directly on" a second element if there exists a surface at which the first element makes a physical contact with the second element. The thickness of the dielectric adhesion promoter layer 140 can be in a range from 50 nm to 300 nm, although lesser and greater thicknesses can also be employed.

The manganese oxide layer 150 includes a dielectric manganese oxide. The chemical composition of the manganese oxide layer 150 can be $MnO_x$, in which x is in a range from 0.95 to 3.5. In one embodiment, x can be in a range from 1.5 to 3.0. In one embodiment, x can be in a range from 1 to 2. In one embodiment, x can be in a range from 0.95 to 1.1. In one embodiment, x can be in a range from 1.95 to 2.05. The dielectric manganese oxide material of the manganese oxide layer 150 can be amorphous or polycrystalline. The manganese oxide layer 150 can be formed, for example, by chemical vapor deposition (CVD), physical vapor deposition (PVD), atomic layer deposition (ALD), and/or electrophoretic deposition. Alternately, the manganese oxide layer 150 can be formed by alternation of deposition of a thin manganese layer (having a thickness, for example, in a range from 1 nm to 10 nm) and oxidation of the deposited manganese layer into a manganese oxide layers until the cumulative thickness reaches a target thickness. The thickness of the manganese oxide layer 150 can be in a range from 50 nm to 200 nm, although lesser and greater thicknesses can also be employed. The manganese oxide layer 150 can be subsequently employed as an etch mask in an anisotropic etch process.

The hard mask dielectric material layer 160, if present, can include a dielectric material such as silicon oxide or silicon nitride. The hard mask dielectric material layer 160 can be employed as an additional etch mask in a subsequent anisotropic etch process. The hard mask dielectric material layer 160 can be deposited, for example, by chemical vapor deposition (CVD). The thickness of the hard mask dielectric material layer 160 can be in a range from 50 nm to 300 nm, although lesser and greater thicknesses can also be employed. The hard mask stack (140, 150, 160) is vertically spaced from the dielectric material layers (20, 120) at least by the second semiconductor substrate 110.

A first photoresist layer 167 is formed on the top surface of the manganese oxide layer 150 or on the top surface of the hard mask dielectric material layer 160 (if the hard mask dielectric material layer 160 is present). The first photoresist layer 167 is lithographically patterned to form an opening over a region including the first metallic pad 130.

Figure 3:
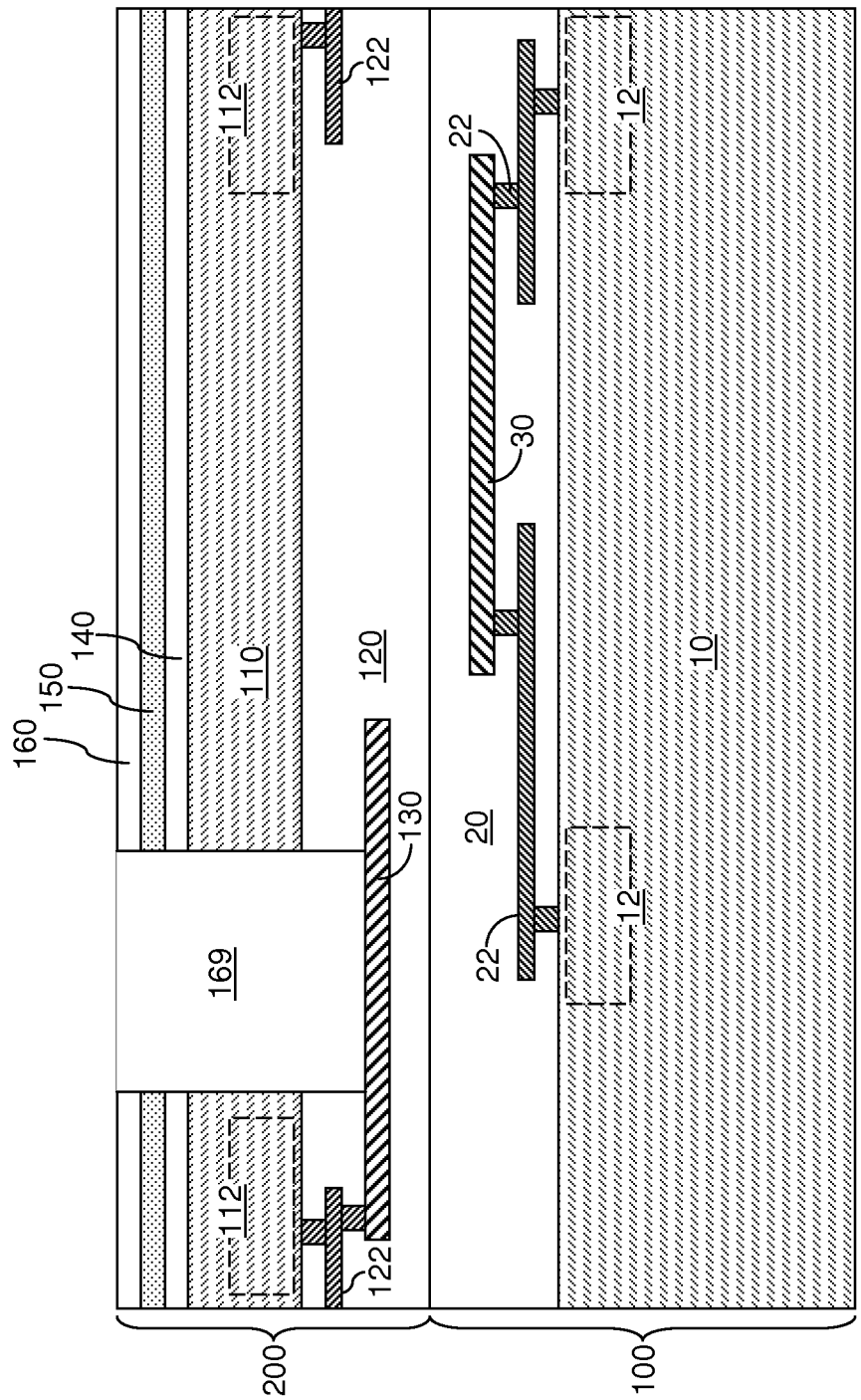
FIG. 3 is a vertical cross-sectional view of the first exemplary structure after formation of a first trench extending into a second pad structure within the second substrate according to the first embodiment of the present disclosure.

Referring to FIG. 3, a first trench 169 is formed through the hard mask stack (140, 150, 160), through the second semiconductor substrate 110, and into an upper portion of the at least one second dielectric material layer 120 by anisotropic etch processes. Specifically, the first photoresist layer 167 can be employed as an etch mask during an anisotropic etch process that etches physically exposed portions of the hard mask dielectric material layer 160, if the hard mask dielectric material layer 160 is present. Etch chemistry known in the art can be employed to anisotropically etch the hard mask dielectric material layer 160.

Subsequently, the first photoresist layer 167 is employed as an etch mask during an anisotropic etch that removes physically exposed portions of the manganese oxide layer 150. The manganese oxide layer 150 is patterned to form an opening therein. In one embodiment, an etch chemistry employing a combination of chlorine ($Cl_2$) and oxygen ($O_2$) can be employed to anisotropically etch the dielectric manganese oxide material in the manganese oxide layer 150. The etch chemistry employing a combination of chlorine ($Cl_2$) and oxygen ($O_2$) forms volatile compounds having chemical formulas of $MnOCl_x$, in which x is a positive integer such as 1, 2, 3, or 4, from the dielectric manganese oxide material. The etch chemistry employing a combination of chlorine ($Cl_2$) and oxygen ($O_2$) is selective to silicon oxide in the presence of oxygen. Thus, the collateral etching of the hard mask dielectric material layer 160 is insignificant in case the hard mask dielectric material layer 160 includes silicon oxide.

Subsequently, the dielectric adhesion promoter layer 140, the second semiconductor substrate 110, and the at least one second dielectric material layer 120 are sequentially etched by anisotropic etch processes that employ the first photoresist layer 167 as an etch mask. The first trench 169 is vertically extended downward until the bottom surface of the first trench 169 reaches a top surface of the second metallic pad 130. The etch chemistries employed to etch through the dielectric adhesion promoter layer 140 and the second semiconductor substrate 110 can be etch chemistries for etching silicon oxide and silicon, respectively, as known in the art. In one embodiment, the first photoresist layer 167 can be employed as an etch mask during the etching of the dielectric adhesion promoter layer 140 and the second semiconductor substrate 110. The at least one second dielectric material layer 120 can be anisotropically etched employing the second metallic pad 130 as an etch stop layer.

In one embodiment, the vertical distance from the interface between the second semiconductor substrate 110 and the at least one second dielectric material layer 120 and the top surface of the second metallic pad 130 can be in a range from 500 nm to 4,000 nm. The first photoresist layer 167 may, or may not, be completely consumed before the first trench 169 extends down to the top surface of the second metallic pad 130. If the first photoresist layer 167 is completely consumed before the first trench 169 extends down to the top surface of the second metallic pad 130, the hard mask dielectric material layer 160 may be partially consumed, or may be completely consumed. If the hard mask dielectric material layer 160 is completely consumed before the bottom surface of the first trench 169 contacts the top surface of the second metallic pad, the manganese oxide layer 150 can be employed as an etch mask.

Irrespective of whether any portion of the hard mask dielectric material layer 160 is removed during the vertical recessing of the first trench 169, the sidewalls of the manganese oxide layer 150 are not significantly recessed laterally. As used herein, a "significant lateral recessing" of a sidewall refers to a lateral recessing by a distance greater than three times surface roughness (as measured peak to peak) of the sidewall. In one embodiment, any lateral recessing of the sidewalls of the manganese oxide layer 150 can be less than 10 nm, or can be less than 3 nm, or can be less than 1 nm. The periphery of the opening in the manganese oxide layer 150 is vertically coincident with the periphery of sidewalls of the portions the first trench 169 in the second semiconductor substrate 110 and the at least one second dielectric material layer 120. Correspondingly, the width of the first trench 169 does not change significantly throughout the entirety of the sidewalls extending from the second metallic pad 130 to the top surface of the manganese oxide layer 150. In one embodiment, any change in the width of the first trench 169 can be less than 10 nm, or less than 3 nm, or less than 1 nm, or can be zero. The horizontal cross-sectional area of the first trench 169, which is invariant with translation along the vertical direction, can be within the area of the second metallic pad 130. Thus, the periphery of the bottom surface of the first trench 169 can be entirety within the periphery of the second metallic pad 130. The first trench 169 does not intersect the bonding interface between the first substrate 100 and the second substrate 200.

In one embodiment, the at least one second dielectric material layer 120 can be anisotropically etched employing an etch chemistry employing the fluorine gas ($F_2$) or other fluorine-based etchants. In this case, non-volatile stable compounds including manganese and fluorine such as $MnF_2$ and $MnF_3$ are formed on physically exposed surfaces of the manganese oxide layer 150. The non-volatile stable compounds including manganese and fluorine coat all physically exposed surfaces of the manganese oxide layer 150, and prevent further etching of the manganese oxide materials underneath. This property can be advantageously employed to enable formation of a deep trench that is more than 1 micron deep below the interface between the second semiconductor substrate 110 and the at least one second dielectric material layer 120 without erosion of the manganese oxide layer 150. The absence of erosion of the manganese oxide layer 150 enables a substantially vertical profile of the sidewalls of the first trench 169. As used herein, a sidewall is "substantially vertical" if all portions of the sidewall deviate from a vertical direction by less than 2 degrees. If a portion of the first photoresist layer 167 remains, the remaining portion of the first photoresist layer 167 can be removed, for example, by ashing.

Figure 4:
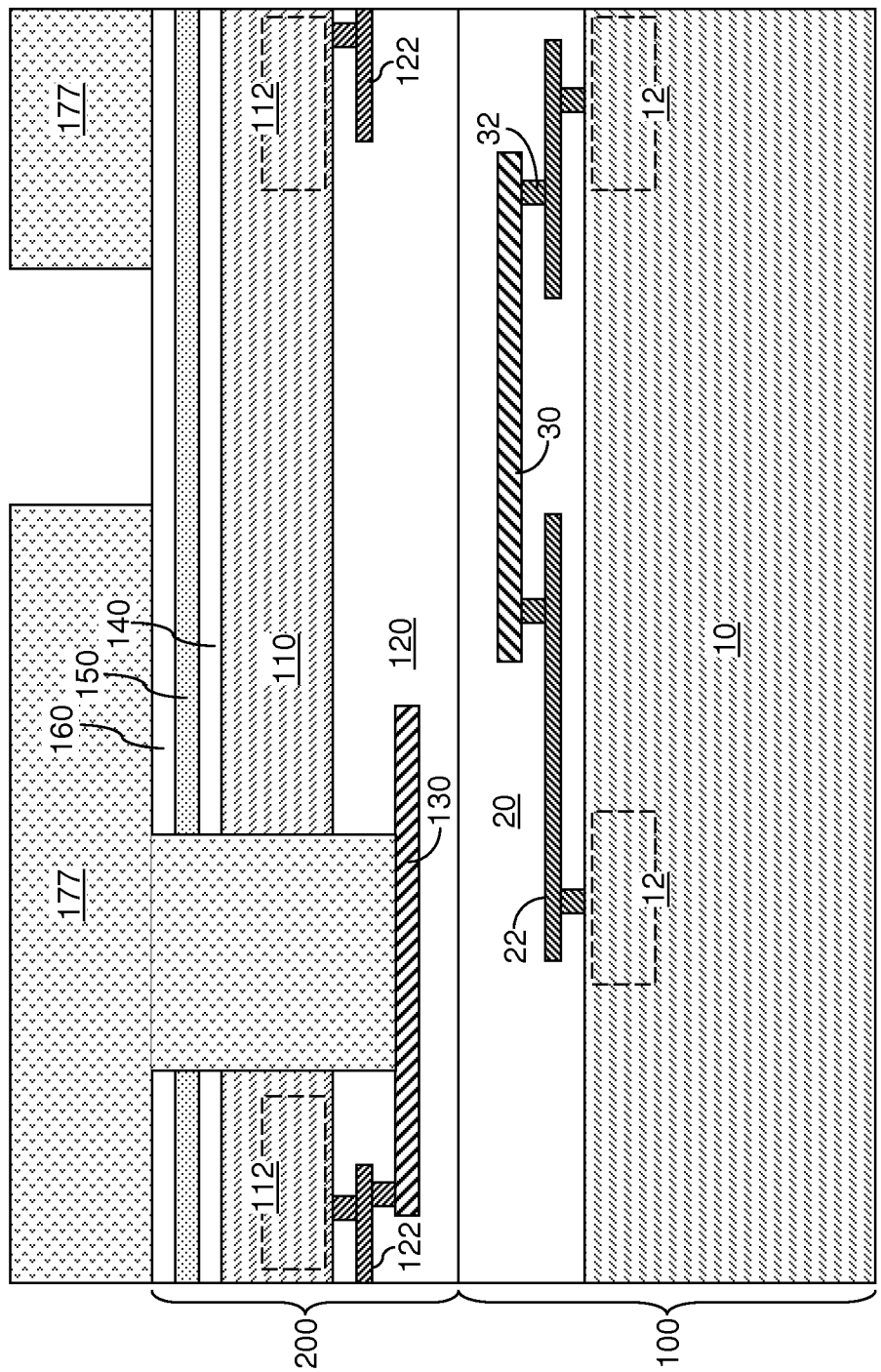
FIG. 4 is a vertical cross-sectional view of the first exemplary structure after application and patterning of a second photoresist layer according to the first embodiment of the present disclosure.

Referring to FIG. 4, a second photoresist layer 177 is formed on the top surface of the manganese oxide layer 150 or on the top surface of the hard mask dielectric material layer 160 (if the hard mask dielectric material layer 160 is present at this step). The second photoresist layer 177 is lithographically patterned to form an opening over a region including the first metallic pad 30. The first trench 169 can be filled with the second photoresist layer 177 at this step.

Figure 5:
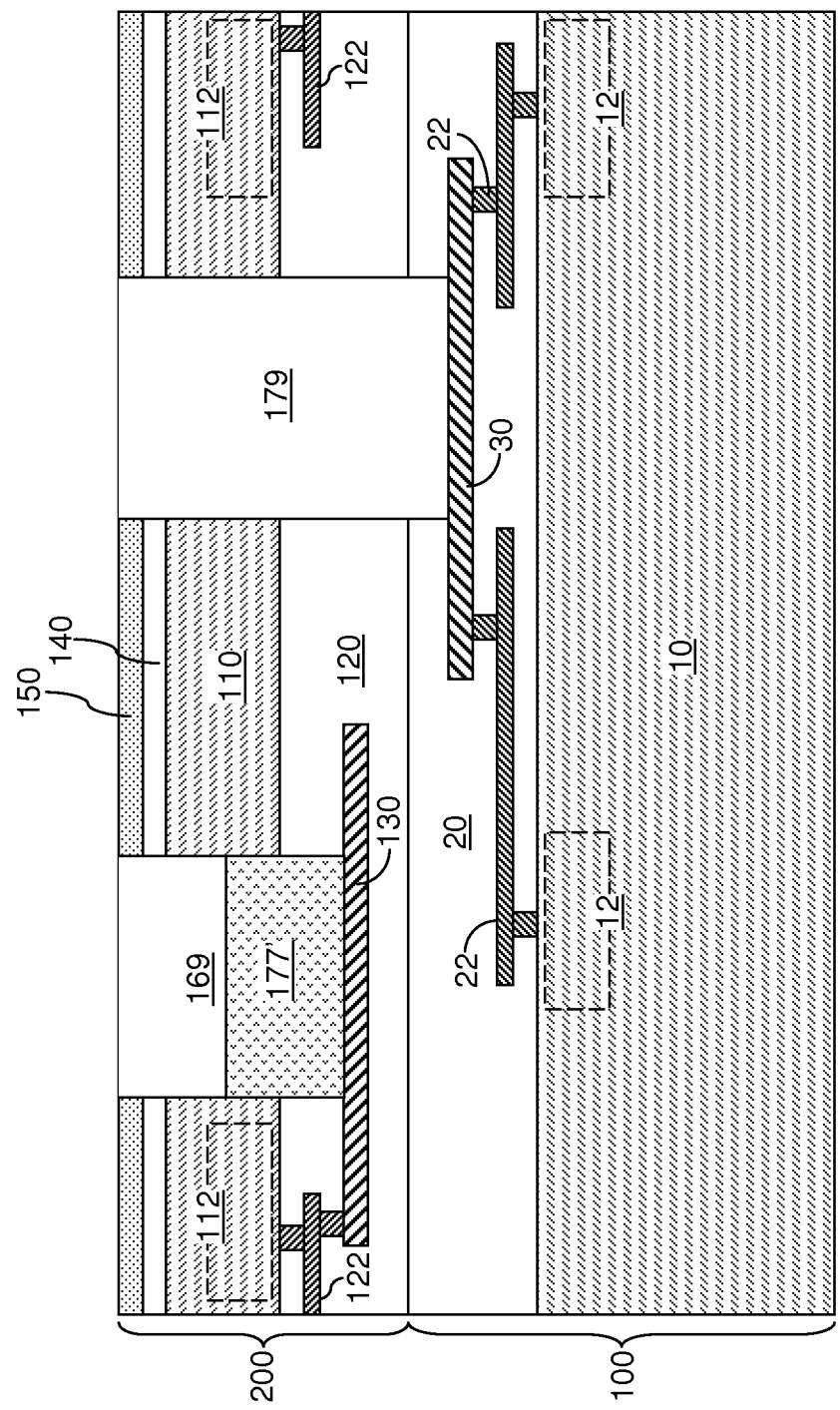
FIG. 5 is a vertical cross-sectional view of the first exemplary structure after formation of a second trench extending to a first pad structure within the first substrate according to the first embodiment of the present disclosure.

Referring to FIG. 5, a second trench 179 is formed through the hard mask stack (140, 150, 160), through the second semiconductor substrate 110, through the at least one second dielectric material layer 120, and into an upper portion of the at least one first dielectric material layer 20 by anisotropic etch processes. Specifically, the second photoresist layer 177 can be employed as an etch mask during an anisotropic etch process that etches physically exposed portions of the hard mask dielectric material layer 160, if the hard mask dielectric material layer 160 is present. Etch chemistry known in the art can be employed to anisotropically etch the hard mask dielectric material layer 160.

Subsequently, the second photoresist layer 177 is employed as an etch mask during an anisotropic etch that removes physically exposed portions of the manganese oxide layer 150. The manganese oxide layer 150 is patterned to form an opening therein. In one embodiment, an etch chemistry employing a combination of chlorine ($Cl_2$) and oxygen ($O_2$) can be employed to anisotropically etch the dielectric manganese oxide material in the manganese oxide layer 150. As discussed above, the collateral etching of the hard mask dielectric material layer 160 is insignificant in case the hard mask dielectric material layer 160 includes silicon oxide.

Subsequently, the dielectric adhesion promoter layer 140, the second semiconductor substrate 110, and the at least one second dielectric material layer 120 are sequentially etched by anisotropic etch processes that employ the second photoresist layer 177 as an etch mask to vertically extend the second trench 179 downward. The bottom surface of the second trench 179 passes through the bonding interface between the first and second substrates (100, 200), and subsequently reaches a top surface of the first metallic pad 30. The etch chemistries employed to etch through the dielectric adhesion promoter layer 140 and the second semiconductor substrate 110 can be etch chemistries for etching silicon oxide and silicon, respectively, as known in the art. In one embodiment, the second photoresist layer 177 can be employed as an etch mask during the etching of the dielectric adhesion promoter layer 140 and the second semiconductor substrate 110. The at least one second dielectric material layer 120 and the at least one first dielectric material layer 20 can be anisotropically etched employing the first metallic pad 30 as an etch stop layer.

In one embodiment, the vertical distance from the interface between the second semiconductor substrate 110 and the at least one second dielectric material layer 120 and the top surface of the first metallic pad 30 can be in a range from 1,000 nm to 8,000 nm. In one embodiment, the second photoresist layer 177 can be completely consumed from above the top surface of the manganese oxide layer 150 or from above the top surface of the hard mask dielectric material layer 160 (if present) before the second trench 179 extends down to the top surface of the first metallic pad 30. The hard mask dielectric material layer 160, if present, may be partially consumed in this case before the bottom surface of the second trench 179 reaches the first metallic pad 30. In this case, the manganese oxide layer 150 can be employed as an etch mask until the second trench 179 reaches the top surface of the first metallic pad 30.

The sidewalls of the manganese oxide layer 150 are not significantly recessed laterally during the anisotropic etch processes. In one embodiment, any lateral recessing of the sidewalls of the manganese oxide layer 150 can be less than 10 nm, or can be less than 3 nm, or can be less than 1 nm. Around the second trench 179, the periphery of the opening in the manganese oxide layer 150 is vertically coincident with the periphery of sidewalls of the portions the second trench 179 in the second semiconductor substrate 110, the at least one second dielectric material layer 120, and the at least one first dielectric material layer 20. Correspondingly, the width of the second trench 179 does not change significantly throughout the entirety of the sidewalls extending from the first metallic pad 30 to the top surface of the manganese oxide layer 150. In one embodiment, any change in the width of the second trench 179 can be less than 10 nm, or less than 3 nm, or less than 1 nm, or can be zero. The horizontal cross-sectional area of the second trench 179, which is invariant with translation along the vertical direction, can be within the area of the first metallic pad 30. Thus, the periphery of the bottom surface of the second trench 179 can be entirety within the periphery of the first metallic pad 30. The second trench 179 intersects, and extends through, the bonding interface between the first substrate 100 and the second substrate 200.

In one embodiment, the at least one second dielectric material layer 120 and the at least one first anisotropic material layer 20 can be anisotropically etched employing an etch chemistry employing the fluorine gas ($F_2$) or other fluorine-based etchants. As discussed above, non-volatile stable compounds including manganese and fluorine such as $MnF_2$ and $MnF_3$ are formed on physically exposed surfaces of the manganese oxide layer 150. The non-volatile stable compounds including manganese and fluorine coat all physically exposed surfaces of the manganese oxide layer 150, and prevent further etching of the manganese oxide materials underneath. This property can be advantageously employed to enable formation of a deep trench that is more than 1 micron deep below the interface between the second semiconductor substrate 110 and the at least one second dielectric material layer 120 without erosion of the manganese oxide layer 150. The absence of erosion of the manganese oxide layer 150 enables a substantially vertical profile of the sidewalls of the second trench 179.

At the end of the anisotropic etch that completes the second trench 179, The first trench 169 can be partially filled with a photoresist material portion 177', which is a remaining portion of the second photoresist layer 177. The photoresist material portion 177' is subsequently removed, for example, by ashing.

Figure 6:
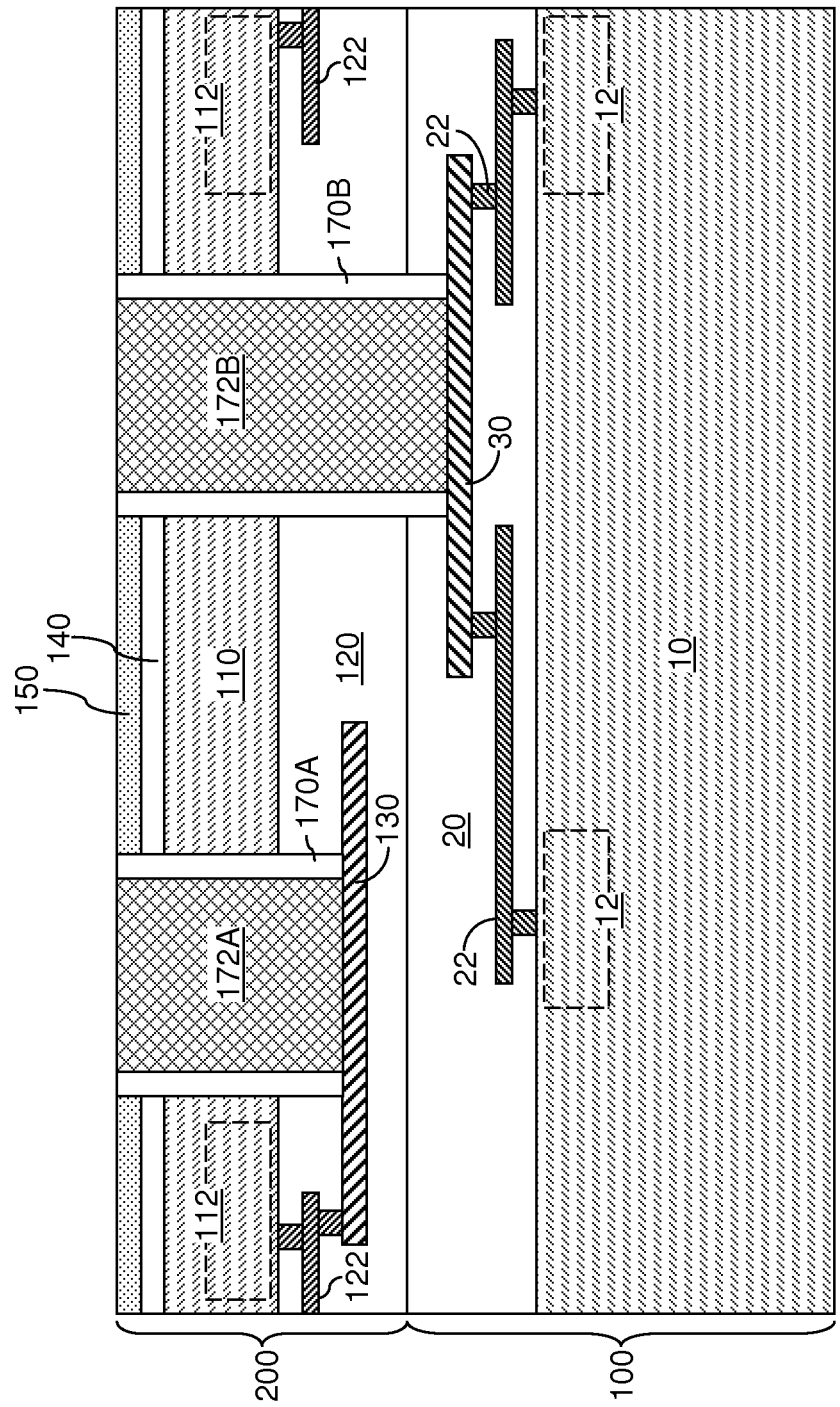
FIG. 6 is a vertical cross-sectional view of the first exemplary structure after formation of dielectric liners and through substrate via structures according to the first embodiment of the present disclosure.

Referring to FIG. 6, dielectric liners (170A, 170B) can be formed on all sidewall surfaces of the first trench 169 (See FIG. 3) and the second trench 179 (See FIG. 5). The dielectric liners (170A, 170B) include a dielectric material, which can be silicon oxide, silicon nitride, silicon oxynitride, a dielectric metal oxide, a dielectric metal nitride, a dielectric metal oxynitride, or a combination thereof. The dielectric liners (170A, 170B) can be formed, for example, by a conformal deposition of a dielectric material layer, and by a subsequent anisotropic etch that removes horizontal portions of the deposited dielectric material layer. A remaining vertical portion of the conformal dielectric material layer within the first trench 169 constitutes a first dielectric liner 170A, and a remaining vertical portion of the conformal dielectric material layer within the second trench 179 constitutes a second dielectric liner 170B. The lateral thickness of the dielectric liners (170A, 170B) can be in a range from 10 nm to 200 nm, although lesser and greater thicknesses can also be employed. Each dielectric liner (170A, 170B) contacts all sidewalls of a trench (169 or 179), which includes the periphery of an opening in the manganese oxide layer 150 and the periphery of the sidewalls of the portion of the trench (169 or 179) within the second semiconductor substrate 110 and the at least one second dielectric material layer 120. The second dielectric liner 170B also contacts the sidewalls of the portion of the second trench 179 within the at least one first dielectric material layer 20.

Subsequently, a conductive material is deposited within remaining portions of the first trench 169 and the second trench 179 and over the manganese oxide layer 150. The conductive material can be deposited directly on the top surface of the manganese oxide layer 150. The conductive material can include, for example, copper, aluminum, tungsten, silver, gold, platinum, although other metallic elements and/ or alloys thereof can also be employed. The conductive material can be deposited, for example, by physical vapor deposition, chemical vapor deposition, electroplating, electroless plating, or combinations thereof. Optionally, metal barriers including a metallic material such as Ta, Ti, W, TaN, TiN, WN, TaC, TiC, WC may be used before depositing the conductive material.

Excess portions of the conductive material above the top surface of the manganese oxide layer 150 can be subsequently removed, for example, by a recess etch, chemical mechanical planarization (CMP), or a combination thereof. A remaining portion of the conductive material within the first trench 169 constitutes a first through substrate via structure 172A, which passes "through" the second semiconductor substrate 110 and contacts the second metallic pad 130. A remaining portion of the conductive material within the second trench 179 constitutes a second through substrate via structure 172B, which passes through the second semiconductor substrate 110 and contacts the first metallic pad 30. In one embodiment, the top surfaces of the first and second through substrate via structures (172A, 172B) can be coplanar with, i.e., located within a same two-dimensional Euclidean plane as, the top surface of the manganese oxide layer 150 after the planarization process.

The first through substrate via structure 172A is embedded within the first dielectric liner 170A, includes the conductive material, and contacts the second metallic pad 130. The second through substrate via structure 172B is embedded within the second dielectric liner 170B, includes the conductive material, and contacts the first metallic pad 30. The first through substrate via structure 172A and the first dielectric liner 170A do not extend through the bonding interface between the first and second substrates (100, 200). The second through substrate via structures 172B and the second dielectric liner 170B extend through the bonding interface between the first and second substrates (100, 200)). The first through substrate via structure 172A and the second through substrate via structure 172B are embedded within the second substrate 200, and are laterally spaced from each other.

Optionally, top surfaces of the first and second through substrate via structures (172A, 172B) can be cleaned, for example, by a wet clean to remove particles of manganese oxide. Chemicals that can be employed to remove particles of manganese oxide include, for example, dilute sulfuric acid, ethyl either, and optional additives that control the rate of removal of the manganese oxide particles and/or provide etch selectivity with respect to other materials.

The manganese oxide layer 150 may, or may not, be partially or completely removed during the planarization process that removes the conducive material to form the first through substrate via structure 172A and second through substrate via structure 172B. In one embodiment, the planarization process can employ the manganese oxide layer 150 as a stopping layer, and as such, the removal of the manganese oxide layer 150 can be insignificant, i.e., the manganese oxide layer 150 can remain substantially intact. In one embodiment, at least a portion of the manganese oxide layer 150 remains after the planarization process. In another embodiment, the manganese oxide layer 150 may be completely removed.

Figure 7:
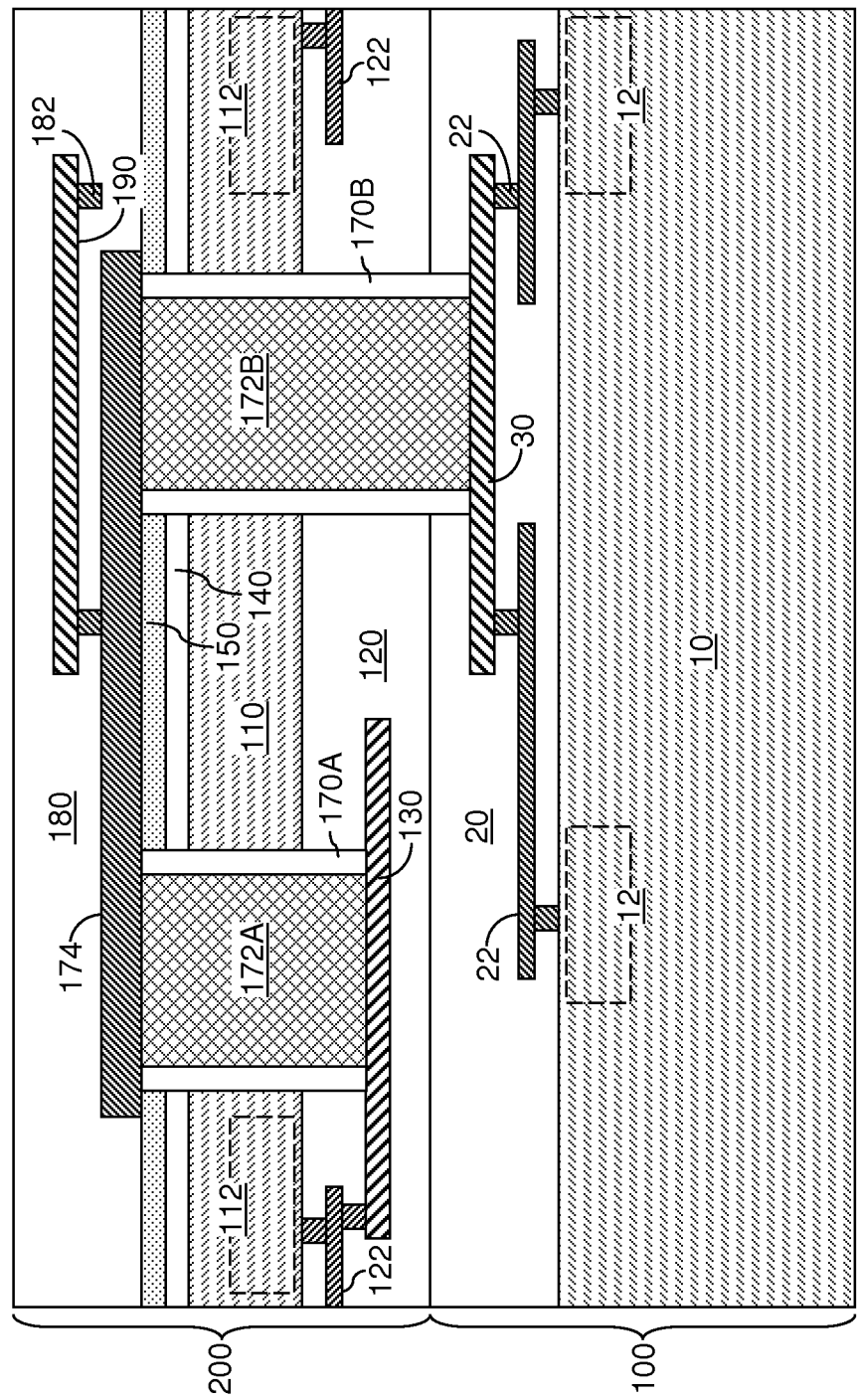
FIG. 7 is a vertical cross-sectional view of a variation of the first exemplary structure after formation of backside metal interconnect structures on the second substrate according to the first embodiment of the present disclosure.

Referring to FIG. 7, backside metal interconnect structures can be formed on the back side of the second semiconductor substrate 110. The backside metal interconnect structures can include, for example, a metal line structure 174 and third metal interconnect structures 182. In addition, a third metallic pad 190 can be formed on the third metal interconnect structures 182. The metal line structure 174, the third metal interconnect structures 182, and the third metallic pad 190 can be embedded within at least one third dielectric material layer 180.

The metal line structure 174 can be formed directly on the top surface of the manganese oxide layer 150. In one embodiment, the metal line structure 174 can be formed directly on the top surfaces of the manganese oxide layer 150, the top surface of the first through substrate via structure 172A, and the top surface of the second through substrate via structure 172B. In this case, the metal line structure 174 in contact with the manganese oxide layer 150 can provide a horizontal electrically conductive path between the first and second through substrate via structures (172A, 172B).

The first exemplary structure includes a manganese oxide layer 150 located on a substrate, i.e., the second semiconductor substrate 100, and a trench, i.e., the second trench 179 (See FIG. 5) extending through an opening in the manganese oxide layer 150 and into the second semiconductor substrate 110. A periphery of the opening is vertically coincident with a periphery of sidewalls of the portion the second trench 179 (See FIG. 5) in the second semiconductor substrate 110. A combination of the at least one first dielectric material layer and the at least one second dielectric material layer 120 is located on the opposite side of the second semiconductor substrate 110 relative to the manganese oxide layer 150. The second trench 179 extends through the second semiconductor substrate 110 and into the combination of the at least one first dielectric material layer 20 and the at least one second dielectric material layer 120. In one embodiment, each of the at least one first dielectric material layer 20 and the at least one second dielectric material layer 120 can include silicon oxide.

A first metallic pad 30 is embedded within the dielectric material layers (20, 120). An end surface, i.e., the bottom surface, of the second trench is a surface of the first metallic pad 30. The second dielectric liner 170B contacts the periphery of the opening in the manganese oxide layer 150 and the periphery of the sidewalls of the portion of the second trench within the second semiconductor substrate 110. The second through substrate via structure 172B is embedded within the second dielectric liner 170B, includes the conductive material, and contacts the first metallic pad 30.

The first semiconductor substrate 10 is located on the dielectric material layers (20, 120), and is vertically spaced from the second semiconductor substrate 110 by the dielectric material layers (20, 120). Each of the first and second semiconductor substrates (10, 110) can include at least one semiconductor device, and the dielectric material layers (20, 120) can include metal interconnect structures (22, 122) that contain at least one of a conductive via and a conductive metal line. The dielectric material layers (20, 120) includes the at least one first dielectric material layer 20 and the at least one second dielectric material layer 120 that are bonded at the bonding interface. The second trench extends through the bonding interface.

The first trench 169 (See FIG. 3) extends through another opening in the manganese oxide layer 150 and into the second semiconductor substrate 110. The periphery of the opening is vertically coincident with the periphery of sidewalls of the portion the first trench 169 (See FIG. 3) in the second semiconductor substrate 110. The first dielectric liner 170A contacts the periphery of the opening and the periphery of the sidewalls of the portion of the first trench. The first through substrate via structure 172A is embedded within the first dielectric liner 170A, includes the conductive material, and contacts the second metallic pad 130 embedded in the dielectric material layers (20, 120). The first trench does not intersect the bonding interface.

The dielectric adhesion promoter layer 140 is a dielectric material layer located over the second semiconductor substrate 110. The manganese oxide layer 150 is vertically spaced from the second semiconductor substrate 110 by the dielectric adhesion promoter layer 140. In one embodiment, the dielectric adhesion promoter layer 140 can be a silicon oxide layer that contacts a top surface of the second semiconductor substrate 110.

Figure 8:
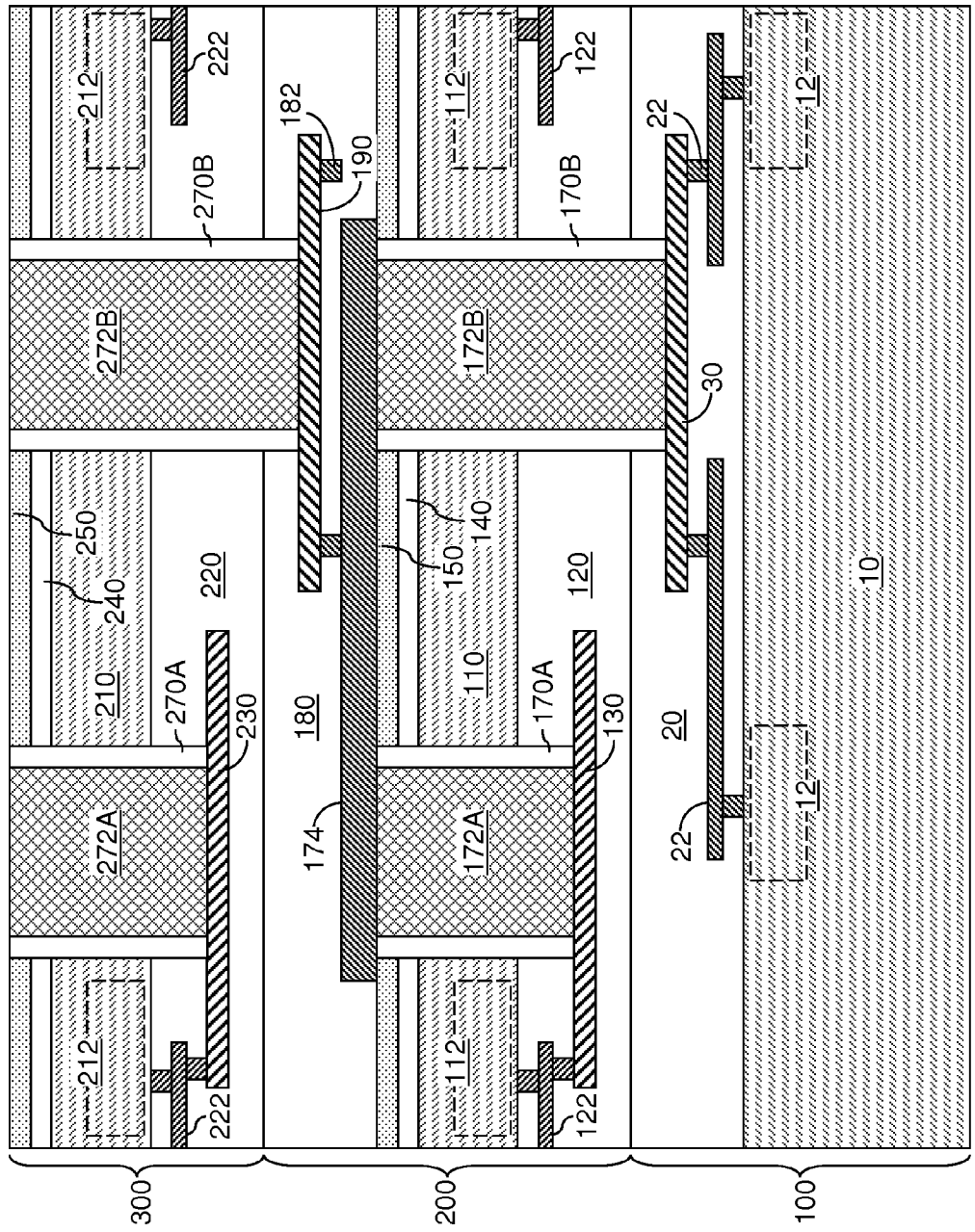
FIG. 8 is a vertical cross-sectional view of the first exemplary structure after optional bonding of a third substrate employing another hard mask stack according to the first embodiment of the present disclosure.

Referring to FIG. 8, a variation of the first exemplary structure is shown, which can be derived from the first exemplary structure of FIG. 7 by bonding a third substrate 300 to the assembly of the first and second substrates (100, 200). In one embodiment, a substrate including a third semiconductor substrate 210 and at least one fourth dielectric material layer 220 can be provided. At least one third semiconductor device 212 is located in, or on, the substrate. Fourth metal interconnect structures 222 and a fourth metallic pad 230 can be embedded within the at least one fourth dielectric material layer 220. The substrate can be bonded to the second substrate 200 by placing the distal surface of the at least one fourth dielectric material layer 220 directly on the distal surface, i.e., top surface, of the at least one third dielectric material layer 180, and by performing an anneal to induce oxide fusion bonding across the interface between the second substrate 200 and the substrate.

The substrate is subsequently thinned, for example, by grinding, polishing, recessing, and/or etching to a desired target thickness for the third semiconductor substrate 210. A dielectric adhesion promoter layer 240, a manganese oxide layer 250, and an optional hard mask dielectric material layer (not shown) can be subsequently deposited on the back side, i.e., the top side, of the third semiconductor substrate 210 employing the same processing steps as the processing steps of FIG. 2. Additional processing steps of FIG. 2 and the processing steps of FIGS. 3-6 can be repeated to provide the variation of the first exemplary structure illustrated in FIG. 8. Optionally, the processing steps of FIG. 7 can be repeated. Further, additional substrate can be bonded by repeating the processing steps of FIGS. 1-7.

A third dielectric liner 270A and a third through substrate via structure 272A can be formed in one of the trenches through the third semiconductor substrate 210, and a fourth dielectric liner 270B and a fourth through substrate via structure 272B can be formed in another of the trenches through the third semiconductor substrate 210. The third through substrate via structure 272A can contact the fourth metallic pad 230, and the fourth through substrate via structure 272B can contact the third metallic pad 190. A metal line structure (not shown) can be formed directly on the top surfaces of the manganese oxide layer 250, the third through substrate via structure 272A, and the fourth through substrate via structure 272B.

Figure 9:
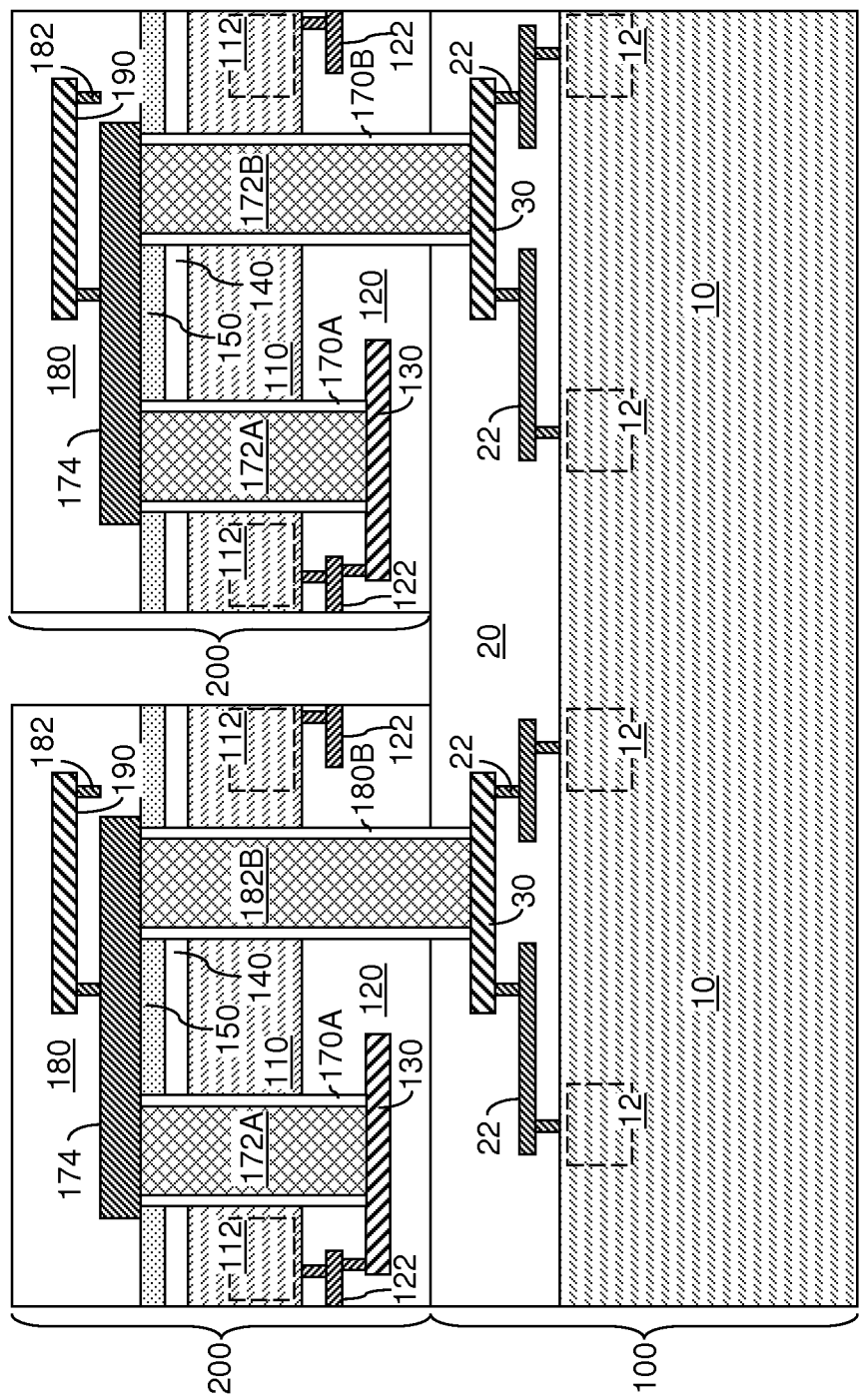
FIG. 9 is a vertical cross-sectional view of a second exemplary structure after bonding a plurality of second substrates to a first substrate according to a second embodiment of the present disclosure.

Referring FIG. 9, a second exemplary structure according to a second embodiment of the present disclosure can be derived from the first exemplary structure by bonding a plurality of second substrates 200 to the first substrate 100 by repeatedly employing the processing steps of FIG. 1-7, or by simultaneously performing the processing steps of FIGS. 1-7 on a plurality of second substrates 200.

Figure 10:
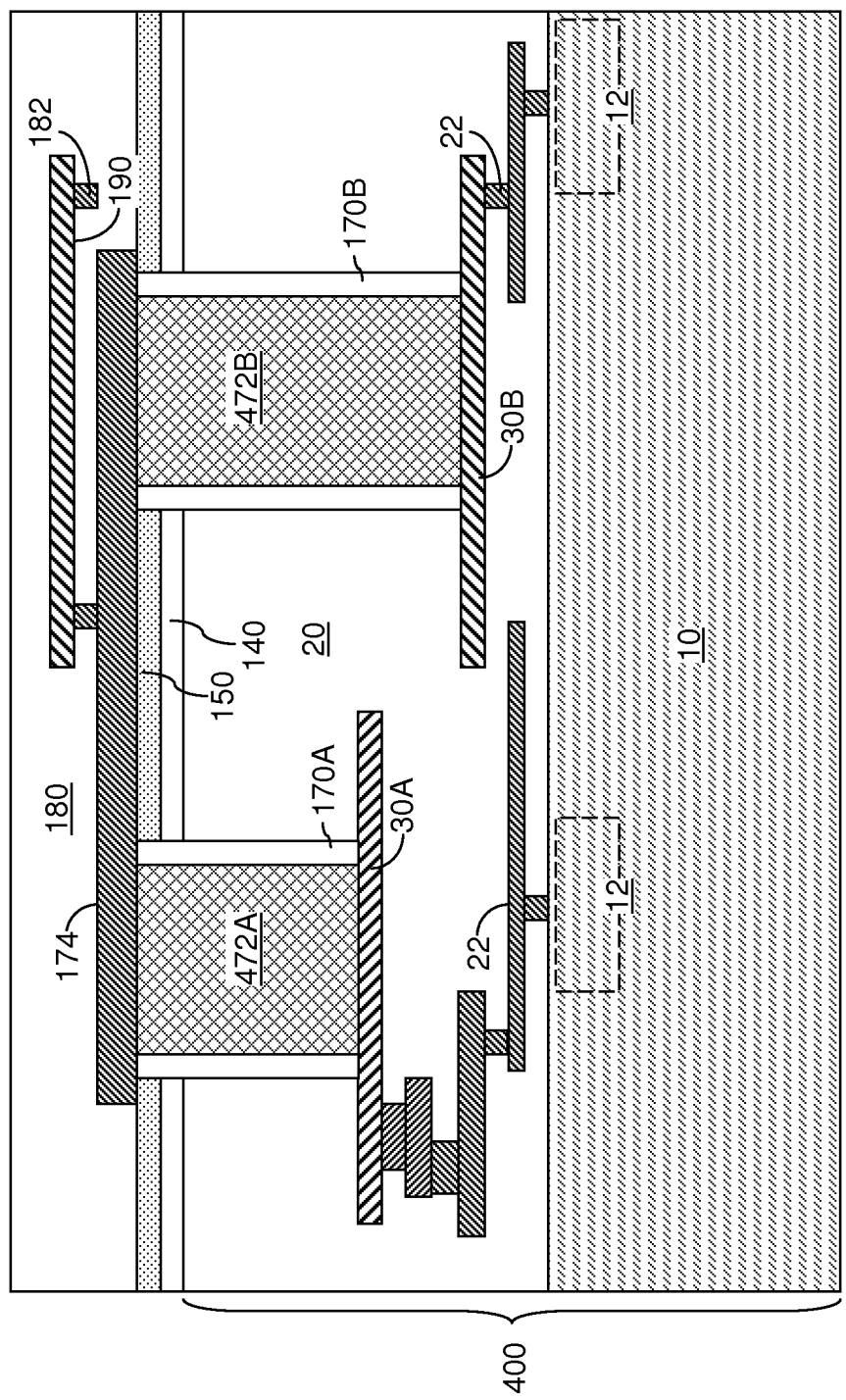
FIG. 10 is a vertical cross-sectional view of a third exemplary structure after formation of conductive via structures employing a hard mask stack according to a third embodiment of the present disclosure.

Referring to FIG. 10, a third exemplary structure according to a third embodiment of the present disclosure can be derived from the first exemplary structure by substituting a substrate 400 for the bonded structure of FIG. 2 including the first substrate 200, the at least one second dielectric material layer 120, and the second semiconductor substrate 110. A dielectric adhesion promoter layer 140, a manganese oxide layer 150, and an optional hard mask dielectric material layer (not shown) can be formed on the back side of the substrate 400 employing the same method as the processing steps of FIG. 2. Subsequently, additional processing steps of FIG. 2 and the processing steps of FIGS. 3-6 can be performed to provide the third exemplary structure illustrated in FIG. 10.

The third exemplary structure includes a first conductive via structure 472A in lieu of the first through substrate via structure 172A of the first embodiment, and includes a second conductive via structure 472B in lieu of the second through substrate via structure 172B because of the absence of a second semiconductor substrate in the third exemplary structure. In other words, the via structures of the third embodiment do not pass through a semiconductor substrate.

The third exemplary structure includes a manganese oxide layer 150 located on a substrate 400, and a trench (which can be the trench containing the first conductive via structure 472A or the trench containing the second conductive via structure 472B) extending through an opening in the manganese oxide layer 150 and into said substrate 400. The periphery of the opening is vertically coincident with the periphery of sidewalls of the portion the trench in the substrate 400.

In one embodiment, the substrate 400 can include a stack of a first semiconductor substrate 10 and at least one first dielectric material layer 20 located thereupon. The trench (which can be the trench containing the first conductive via structure 472A or the trench containing the second conductive via structure 472B) extends into the at least one first dielectric material layer 20. A bottom surface of the trench is coincident with a surface of a metallic pad (which can be a first metallic pad 30A or a second metallic pad 20B) embedded within the at least one first dielectric material layer 20. Each conductive via structure (472A, 472B) is within a trench and directly on a metallic pad. A metal line structure 174 can be formed directly on the conductive via structures (472A, 472B) and the top surface of the manganese oxide layer 150.

The manganese oxide layer 150 of the present disclosure provides superior resistance to an anisotropic etch employing fluorine-containing chemistry due to formation of stable non-volatile manganese fluoride compounds, and thus, can be advantageously employed to provide an anisotropic etch with a high selectivity, and to form a trench with a high aspect ratio and/or with straight sidewall profiles.

Figure 11:
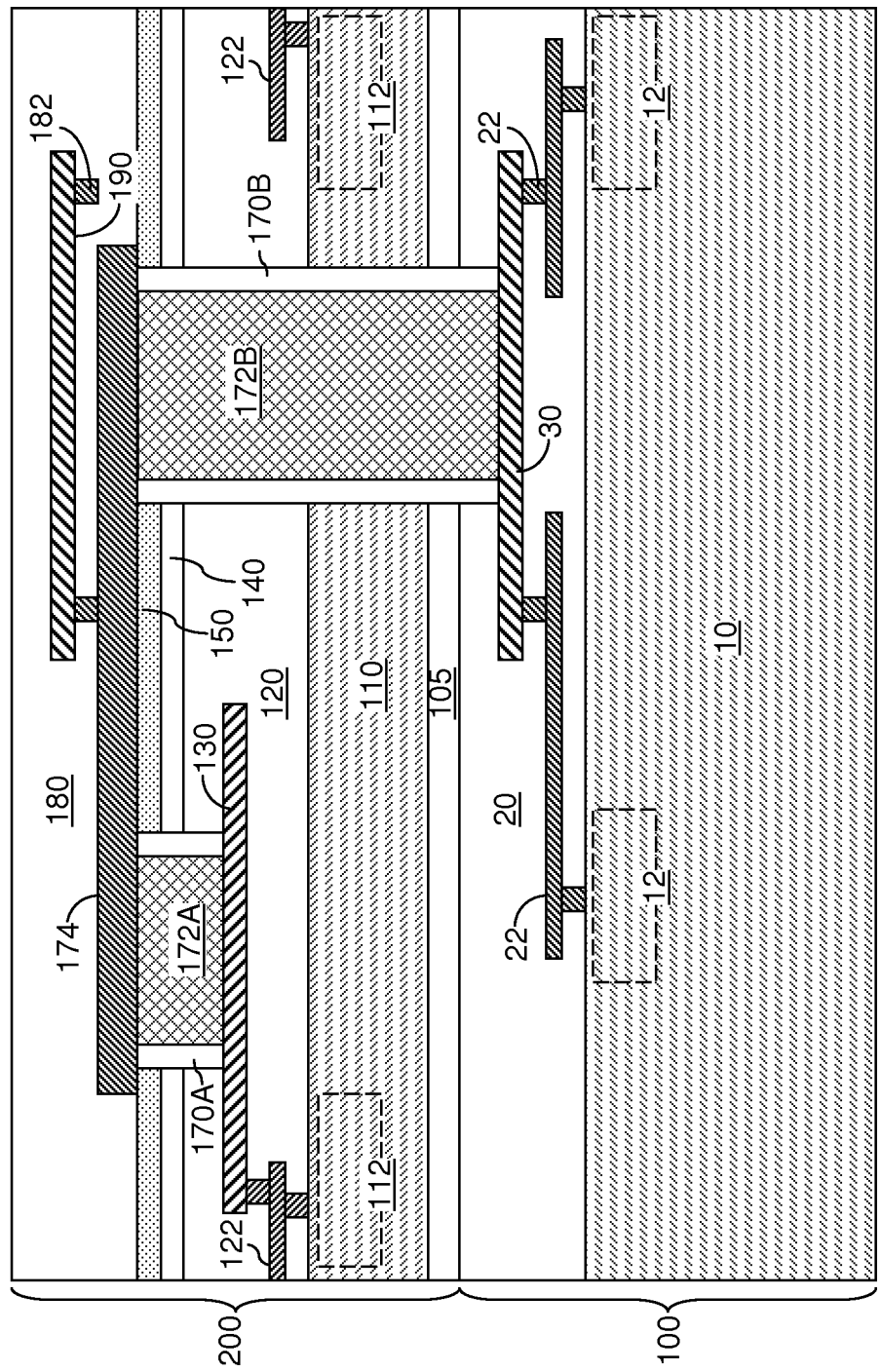
FIG. 11 is a vertical cross-sectional view of a fourth exemplary structure after formation of formation of backside metal interconnect structures on the second substrate according to a fourth embodiment of the present disclosure.

Referring to FIG. 11, a fourth exemplary structure according to a fourth embodiment of the present disclosure can be derived from any of the first, second, and third exemplary structures by bonding the first substrate 100 and the second substrate 200 front-to-back, or "face-to-back." In this case, a bonding material layer 105 can be formed on the back side of the second semiconductor substrate 110 to promote bonding with at least one first dielectric material layer 20. At least another bonding material layer (not shown) may be optionally employed. An oxide-to-oxide bonding is induced across the bonding interface between the first and second substrates (100, 200) by an anneal, with or without compression of the substrates (100, 200), at an elevated temperature, which can be in a range from 200° C. to 500° C., although lesser and greater temperatures can also be employed. The bonding interface between the first and second substrate (100, 200) can be defined by intermittent cavities caused by imperfections in the planarity of the distal surfaces of the dielectric material layers (10, 20), and/or by a horizontal plane containing imperfections in bonding.

The processing steps of FIGS. 2-7 can be subsequently performed. In the fourth exemplary structure illustrated in FIG. 11, the first through substrate via structure 172A does not pass through the second semiconductor substrate 110 and contacts the second metallic pad 130, and the second through substrate via structure 172B passes through the second semiconductor substrate 110 and contacts the first metallic pad 30. In one embodiment, the top surfaces of the first and second through substrate via structures (172A, 172B) can be coplanar with, i.e., located within a same two-dimensional Euclidean plane as, the top surface of the manganese oxide layer 150 after the planarization process.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A structure comprising:
   a manganese oxide layer located on a semiconductor substrate;
   at least one dielectric material layer located on an opposite side of said semiconductor substrate relative to said manganese oxide layer; and
   a trench extending through an opening in said manganese oxide layer and into said at least one dielectric material layer through said semiconductor substrate, wherein a periphery of said opening is vertically coincident with a periphery of sidewalls of said trench.

2. The structure of claim 1, further comprising a metallic pad embedded within said at least one dielectric material layer, wherein an end surface of said trench is a surface of said metallic pad.

3. The structure of claim 2, further comprising:
   a dielectric liner contacting said periphery of said opening and said periphery of said sidewalls of said trench; and
   a through substrate via structure embedded within said dielectric liner, comprising a conductive material, and contacting said metallic pad.

4. The structure of claim 2, further comprising another semiconductor substrate located on said at least one dielectric material layer and vertically spaced from said semiconductor substrate by said at least one dielectric material layer.

5. The structure of claim 4, wherein said at least one dielectric material layer comprises a first dielectric material layer and a second dielectric material layer that are bonded at a bonding interface, and said trench extends through said bonding interface.

6. The structure of claim 4, further comprising a metal line structure contacting a top surface of said through substrate via structure and a top surface of manganese oxide layer.

7. The structure of claim 6, further comprising another through substrate via structure embedded in said semiconductor substrate and laterally spaced from said through substrate via structure and contacting said metal line structure.

8. The structure of claim 7, further comprising:
   another trench extending through another opening in said manganese oxide layer and into said at least one dielectric material layer through said semiconductor substrate, wherein a periphery of said another opening is vertically coincident with a periphery of sidewalls of said another trench; and
   another dielectric liner contacting said periphery of said another opening and said periphery of said sidewalls of said another trench,
   wherein said another through substrate via structure is embedded within said another dielectric liner, comprises said conductive material, and contacts another metallic pad embedded in said at least one dielectric material layer.

9. The structure of claim 8, wherein said at least one dielectric material layer comprises a first dielectric material layer and a second dielectric material layer that are bonded at a bonding interface, and said trench extends through said bonding interface, and said another trench does not intersect said bonding interface.

10. The structure of claim 1, further comprising a dielectric adhesion promoter layer located over said semiconductor substrate, wherein said manganese oxide layer is vertically spaced from said semiconductor substrate at least by said adhesion promoter layer.

11. A structure comprising:
   a manganese oxide layer located on a substrate;
   at least one dielectric material layer located on an opposite side of said substrate relative to said manganese oxide layer;
   a trench extending through an opening in said manganese oxide layer and into said at least one dielectric material layer through said substrate, wherein a periphery of said opening is vertically coincident with a periphery of sidewalls of said trench; and
   a metallic pad embedded within said at least one dielectric material layer, wherein an end surface of said trench is a surface of said metallic pad.

12. The structure of claim 11, further comprising:
   a dielectric liner contacting said periphery of said opening and said periphery of said sidewalls of said trench; and
   a through substrate via structure embedded within said dielectric liner, comprising a conductive material, and contacting said metallic pad.

13. The structure of claim 12, further comprising another substrate located on said at least one dielectric material layer and vertically spaced from said substrate by said at least one dielectric material layer.

14. The structure of claim 13, wherein said at least one dielectric material layer comprises a first dielectric material layer and a second dielectric material layer that are bonded at a bonding interface, and said trench extends through said bonding interface.

15. The structure of claim 14, further comprising a metal line structure contacting a top surface of said through substrate via structure and a top surface of manganese oxide layer.

16. The structure of claim 15, further comprising another through substrate via structure embedded in said substrate and laterally spaced from said through substrate via structure and contacting said metal line structure.

17. The structure of claim 16, further comprising:
   another trench extending through another opening in said manganese oxide layer and into said at least one dielectric material layer through said substrate, wherein a periphery of said another opening is vertically coincident with a periphery of sidewalls of said another trench; and another dielectric liner contacting said periphery of said another opening and said periphery of said sidewalls of said another trench,
wherein said another through substrate via structure is embedded within said another dielectric liner, comprises said conductive material, and contacts another metallic pad embedded in said at least one dielectric material layer.

18. The structure of claim 17, wherein said at least one dielectric material layer comprises a first dielectric material layer and a second dielectric material layer that are bonded at a bonding interface, and said trench extends through said bonding interface, and said another trench does not intersect said bonding interface.

19. The structure of claim 11, further comprising a dielectric adhesion promoter layer located over said substrate, wherein said manganese oxide layer is vertically spaced from said substrate at least by said adhesion promoter layer.

20. The structure of claim 11, wherein said substrate is a semiconductor substrate.

* * * * *